United States Patent
Suzuki et al.

(10) Patent No.: US 9,820,394 B2
(45) Date of Patent: Nov. 14, 2017

(54) CIRCUIT BOARD ATTACHMENT STRUCTURE AND ELECTRONIC DEVICE ADOPTING THE SAME

(71) Applicant: KABUSHIKI KAISHA TOSHIBA, Minato-ku, Tokyo (JP)

(72) Inventors: Hiromichi Suzuki, Tokyo (JP); Masataka Tokoro, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/288,755

(22) Filed: Oct. 7, 2016

(65) Prior Publication Data

US 2017/0105295 A1 Apr. 13, 2017

(30) Foreign Application Priority Data

Oct. 9, 2015 (JP) .................. 2015-201201

(51) Int. Cl.
| | | |
|---|---|---|
| H05K 5/00 | (2006.01) | |
| H05K 9/00 | (2006.01) | |
| H01R 12/71 | (2011.01) | |
| H05K 1/02 | (2006.01) | |
| H05K 5/02 | (2006.01) | |
| G06F 1/16 | (2006.01) | |
| H01R 12/52 | (2011.01) | |

(52) U.S. Cl.
CPC ............ *H05K 5/0069* (2013.01); *G06F 1/16* (2013.01); *H01R 12/52* (2013.01); *H01R 12/71* (2013.01); *H05K 1/0215* (2013.01); *H05K 5/0204* (2013.01); *H05K 5/0247* (2013.01); *H05K 9/0015* (2013.01)

(58) Field of Classification Search
CPC ..... H05K 1/0215; H05K 5/006; H05K 9/0015
See application file for complete search history.

(56) References Cited

U.S. PATENT DOCUMENTS

| | | | | |
|---|---|---|---|---|
| 6,624,503 | B1 * | 9/2003 | Madsen ............. | G11B 33/1493 257/428 |
| 7,813,138 | B2 * | 10/2010 | Takeguchi ............ | G06F 1/1616 361/749 |
| 9,078,351 | B2 * | 7/2015 | Matano ................ | H05K 1/0213 |
| 9,433,090 | B2 * | 8/2016 | Atkinson ............. | H05K 1/0218 |
| 9,596,748 | B2 * | 3/2017 | Lim ..................... | H05K 1/0215 |

(Continued)

FOREIGN PATENT DOCUMENTS

| | | |
|---|---|---|
| JP | 08-018266 | 1/1996 |
| JP | 2010-272757 | 12/2010 |
| JP | 2011-233421 | 11/2011 |

*Primary Examiner* — Hung V Ngo
(74) *Attorney, Agent, or Firm* — Rutan & Tucker, LLP

(57) ABSTRACT

According to one embodiment, a circuit board attachment structure comprise a housing to which the circuit board is attached, a mount provided on the housing and provided outside a portion of the housing where the circuit board is attached, a holding piece extending from the mount to and on the circuit board and sandwiching the circuit board with the housing, and a conductive gasket contacting the circuit board. The gasket is provided at least in a region where the circuit board is sandwiched between the holding piece and the housing, and the gasket is pressed between the holding piece and the housing, and the circuit board and the housing is electrically connected to each other via the pressed gasket.

12 Claims, 11 Drawing Sheets

(56) References Cited

U.S. PATENT DOCUMENTS

| | | | | |
|---|---|---|---|---|
| 2015/0029682 A1* | 1/2015 | Kadoya | ............... | H05K 9/0039 |
| | | | | 361/748 |
| 2015/0313035 A1* | 10/2015 | Kroeckel | ............... | H05K 1/117 |
| | | | | 361/759 |
| 2016/0113129 A1* | 4/2016 | Raschke | ............... | H05K 5/006 |
| | | | | 361/759 |
| 2016/0174377 A1* | 6/2016 | Chuah | ................. | H05K 1/144 |
| | | | | 361/784 |

\* cited by examiner

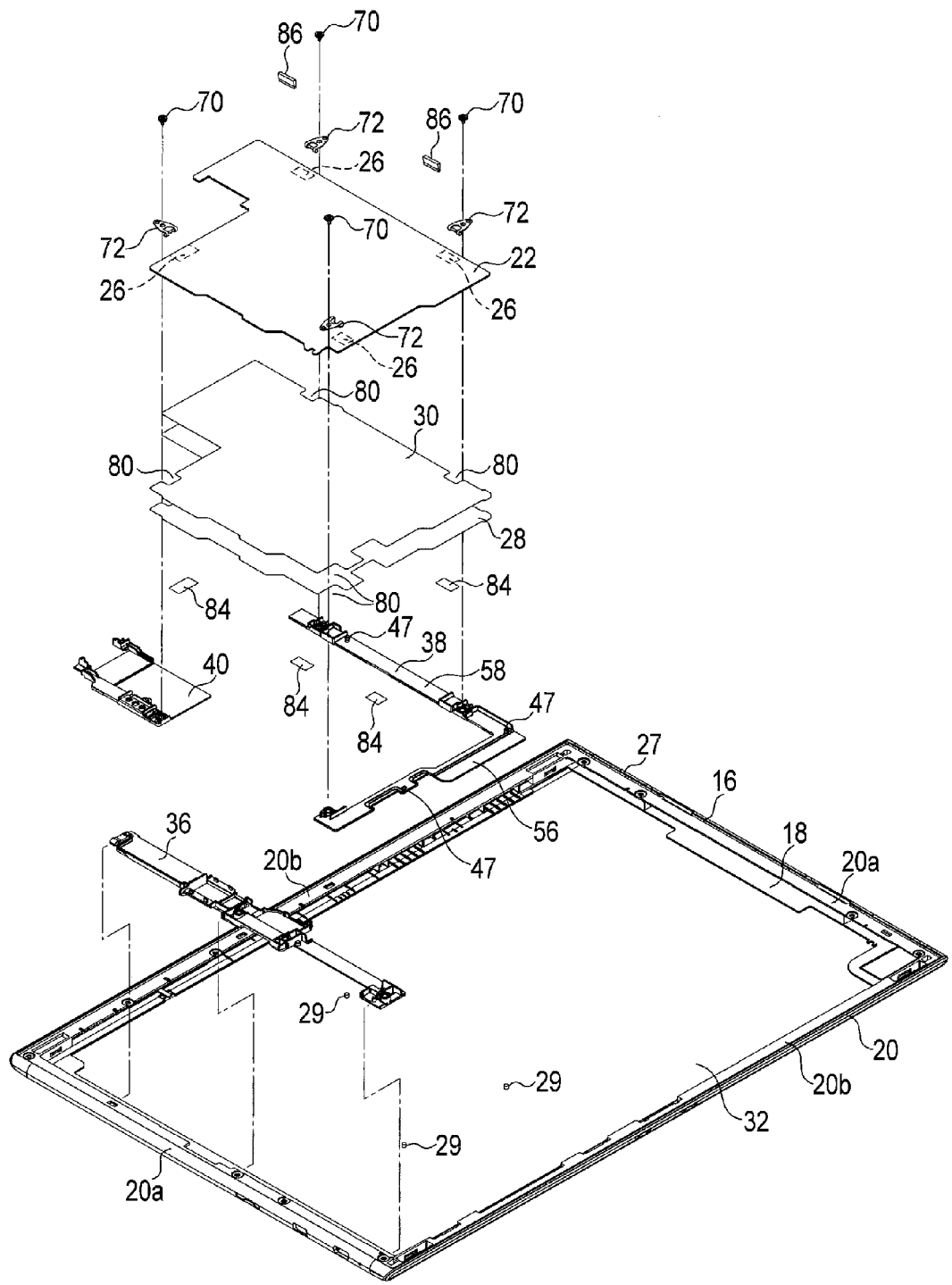
F I G. 4

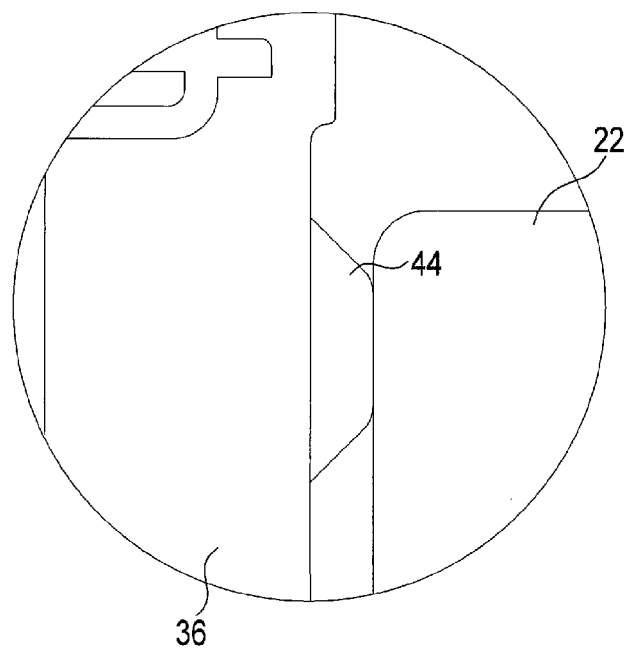
F I G. 11
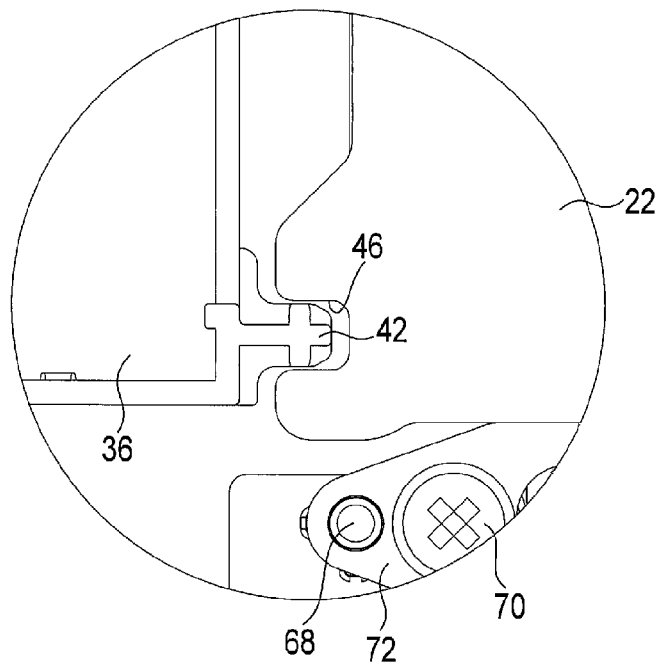
F I G. 12

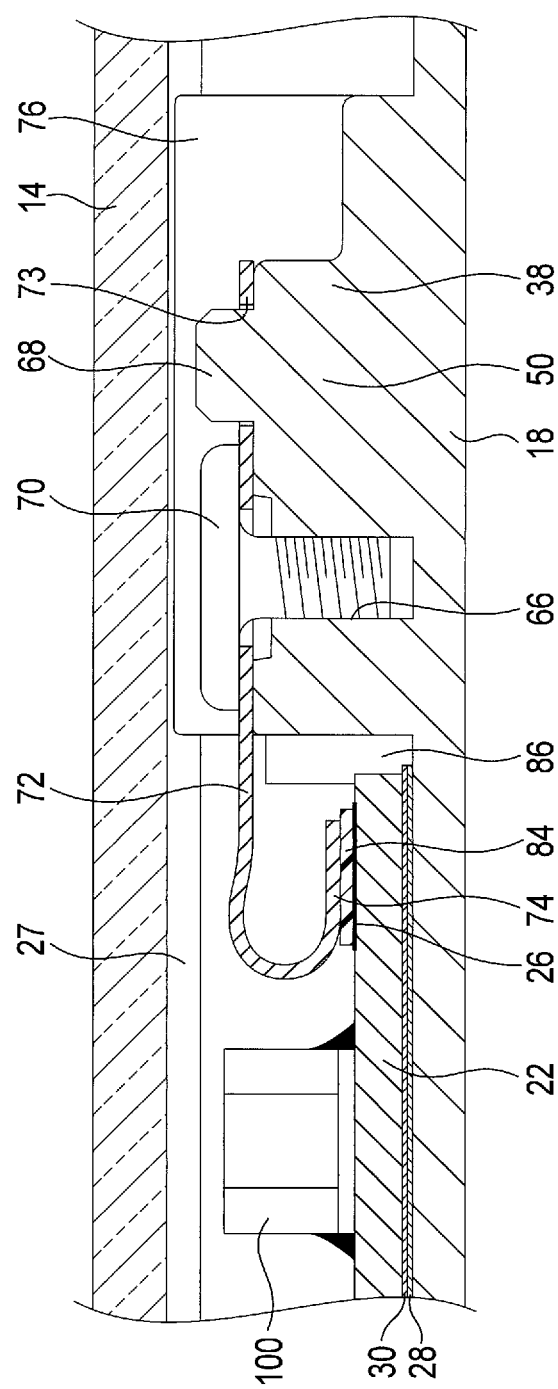
F I G. 15

CIRCUIT BOARD ATTACHMENT STRUCTURE AND ELECTRONIC DEVICE ADOPTING THE SAME

CROSS-REFERENCE TO RELATED APPLICATIONS

This application is based upon and claims the benefit of priority from Japanese Patent Application No. 2015-201201, filed Oct. 9, 2015, the entire contents of which are incorporated herein by reference.

FIELD

Embodiments described herein relate generally to a circuit board attachment structure for electrically connecting a circuit board and a housing to each other, and an electronic device which adopts the circuit board attachment structure.

BACKGROUND

In the case of a small circuit board, it is necessary to stabilize ground potential of the circuit board by electrically connecting a ground electrode of the circuit board to a housing of an electronic device. As a technique of electrically connecting the circuit board and the housing to each other, use of a conductive gasket is known. In the case of using the conductive gasket, it is possible to obtain excellent electrical connection to the circuit board by pressing the conductive gasket against the circuit board.

For example, in an electronic device, a rib is provided in a housing in such a manner as to press a gasket when the housing is assembled. Further, there is an idea of providing a gasket between a circuit board and a housing, attaching double-sided adhesive tape around the gasket, and pressing the gasket when connecting the circuit board and the housing to each other with the double-sided adhesive tape.

In the case of a flat electronic device, it is difficult to impose a load on a housing by providing a rib in the housing because there is a danger that the housing will be deformed. Further, in consideration of the maintainability of a circuit board, it is difficult to fix a circuit board to a housing with a double-sided adhesive tape because there is a possibility that the circuit board will be broken at the time of replacement.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

FIG. 4 is an exploded view of the housing of the tablet computer.

FIG. 11 is a plan view of a part of the circuit board attachment structure.

FIG. 12 is a plan view of a part of the circuit board attachment structure.

FIG. 15 is a sectional view of a part of a circuit board attachment structure of another embodiment.

DETAILED DESCRIPTION

Various embodiments will be described hereinafter with reference to the accompanying drawings.

Figure 1:
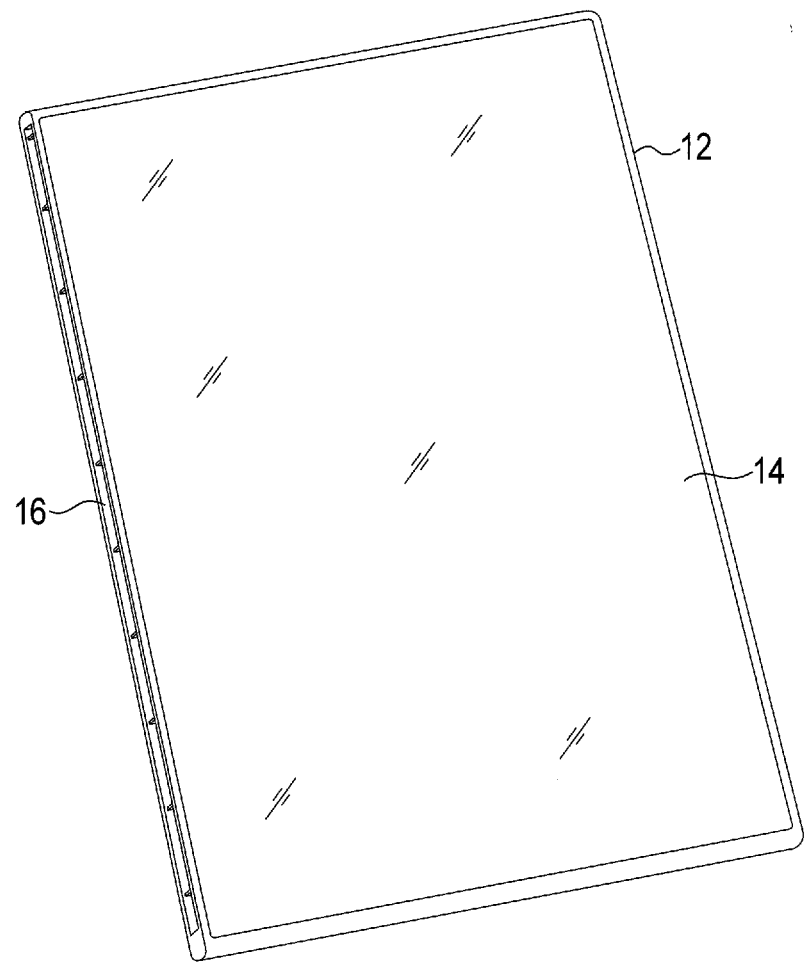
FIG. 1 is a perspective view of a tablet computer as an example of an electronic device.

In general, according to one embodiment, a circuit board attachment structure of the first embodiment will be described with reference to the accompanying drawings. FIG. 1 is a perspective view of a tablet computer 12 as an example of an electronic device adopting the circuit board attachment structure. The tablet computer 12 comprises an image display panel 14 on the front and a housing 16 on the rear of the image display panel 14 as shown in FIG. 1.

Figure 2:
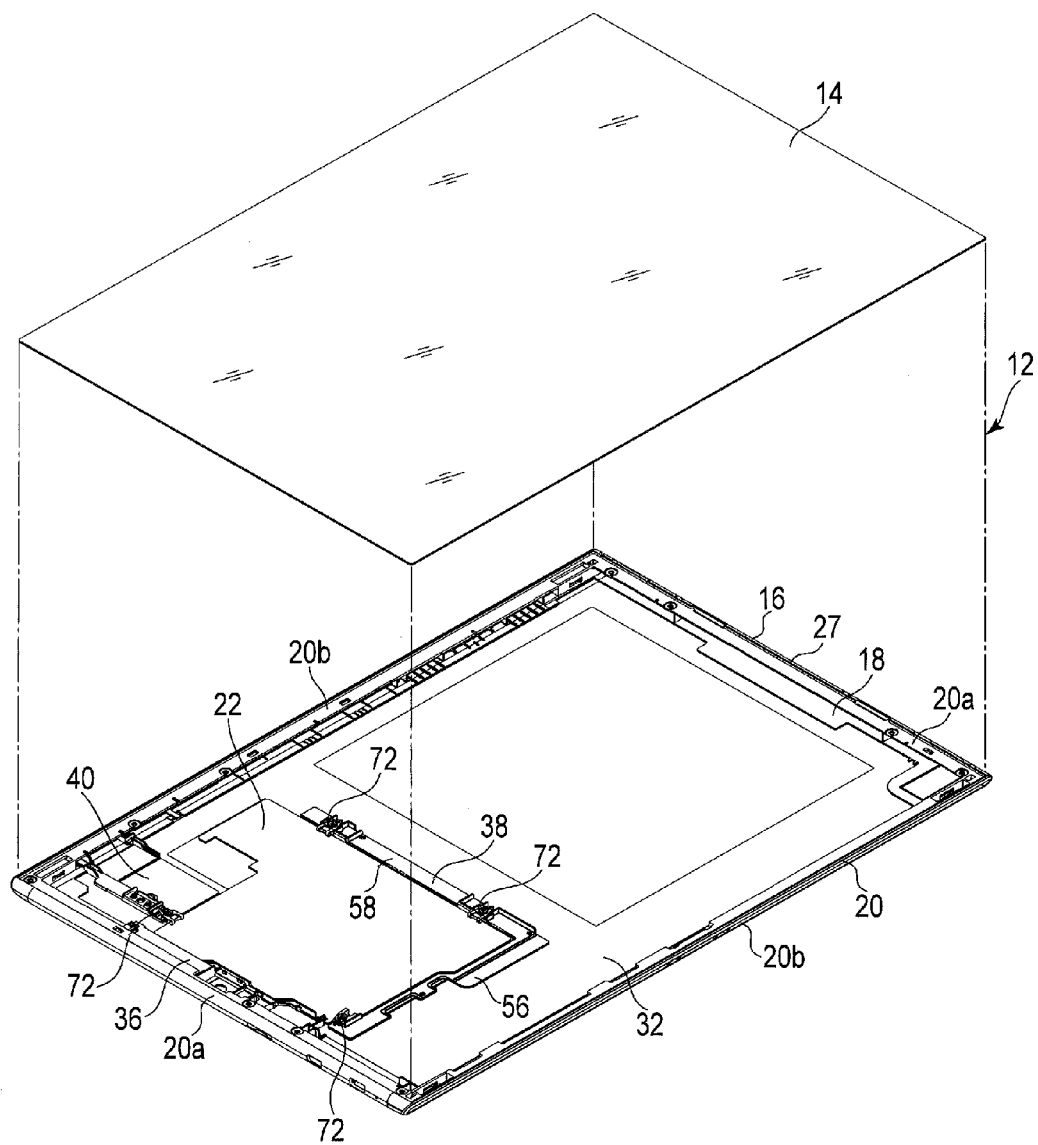
FIG. 2 is an exploded view of the tablet computer.

FIG. 2 is an exploded view of the tablet computer 12, showing the image display panel 14 and the housing 16 separately. The image display panel 14 is, for example, a liquid crystal display panel which displays an image by driving crystal liquid and transmitting light through the crystal liquid. The housing 16 is attached to the rear of the image display panel 14. Note that the image display panel 14 is not necessarily limited to a liquid crystal display panel.

The housing 16 comprises a flat base plate 18 and an edge 20 continuously formed along the four sides of the base plate 18. In the housing 16, the side on which the edge 20 rises from the base plate 18 is assumed to be the upper side or the front, while the other side is assumed to be the lower side or the rear.

Figure 3:
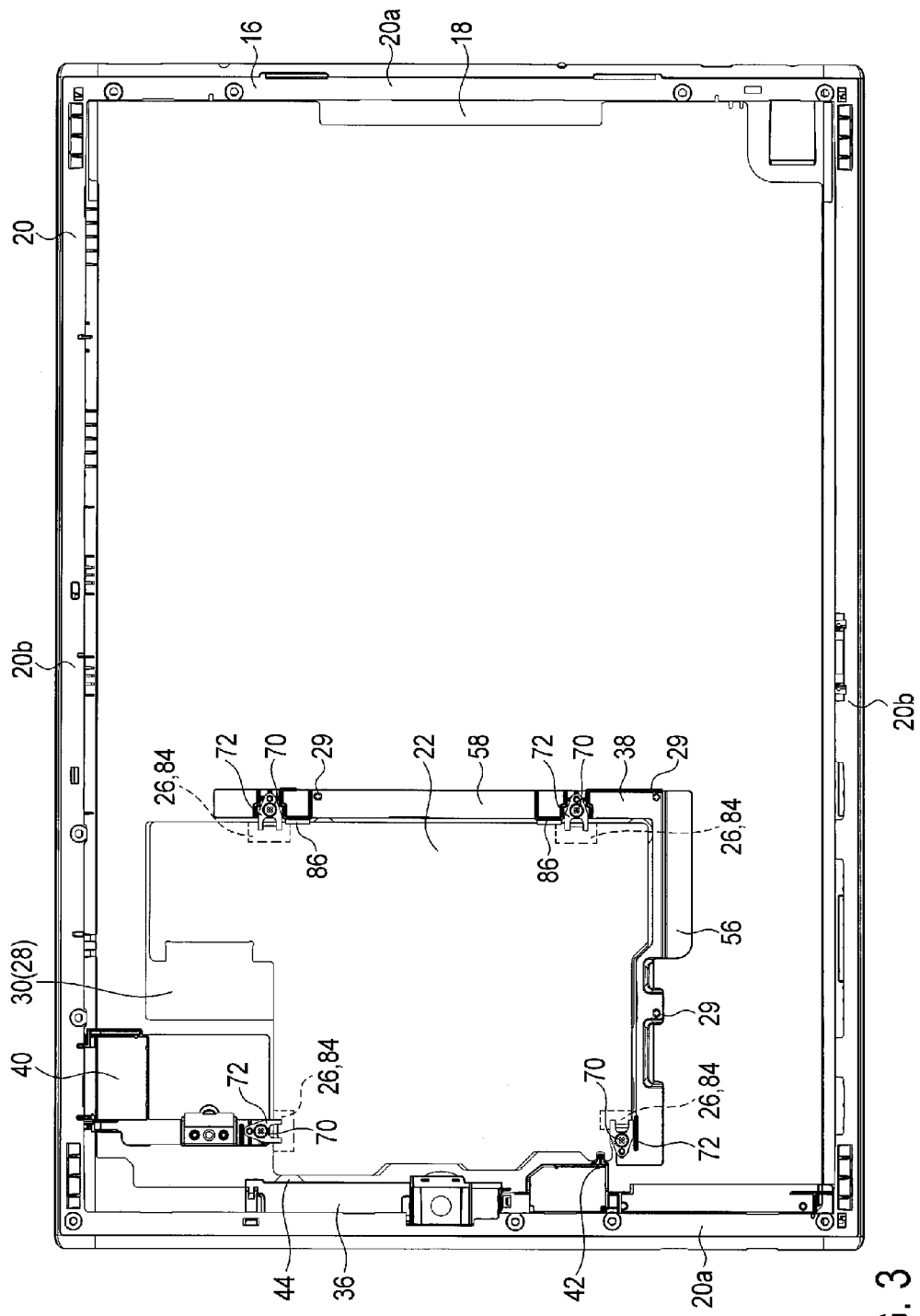
FIG. 3 is a top plan view of a housing of the tablet computer.
Figure 5:
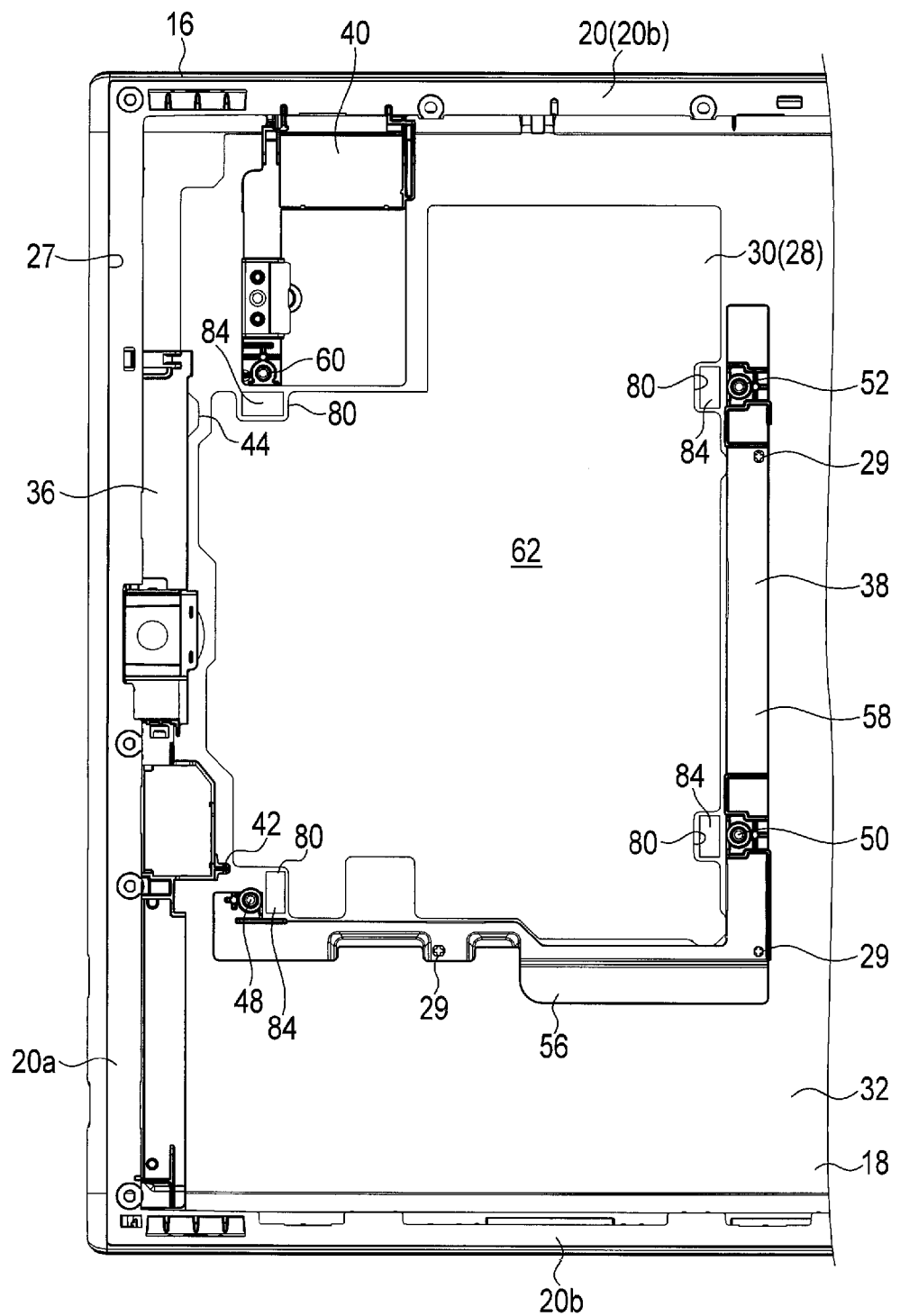
FIG. 5 is a partial top plan view of the housing.

FIG. 3 is a top plan view of the housing 16. FIG. 4 is an exploded view of the housing 16, showing attached components such as the circuit board and the like separately. FIG. 5 is a partial top plan view of a part of the housing 16 from which the circuit board 22 is detached.

The base plate 18 is made of carbon fiber impregnated with resin and then solidified, that is, a carbon-fiber-reinforced resin material. Note that the base plate 18 is not necessarily limited to a carbon-fiber-reinforced resin material but may be another material.

The base plate 18 is rectangular, having predetermined dimensions. The base plate 18 is strong enough to add predetermined stiffness to the housing 16 when the housing 16 is assembled, but still the base plate 18 is desirably light. Around the periphery of the base plate 18, the edge 20 is provided as shown in FIGS. 2 and 3.

The edge 20 is made of a synthetic resin material and is formed integrally with the base plate 18, for example, by an injection molding method. The edge 20 rises from the base plate 18 as shown in FIG. 4. The upper part of the edge 20 comprises a step 27, and the image display panel 14 is attached to the step 27. Further, the edge 20 comprises various electrical connectors, various card slots and the like.

The edge 20 comprises a pair of short sides 20a along the lateral base plate 18 and a pair of long sides 20b along the longitudinal base plate 18. The short sides 20a face each other, and the long sides 20b face each other.

Still further, a position determination projection 29 is provided on the surface of the base plate 18. The projection 29 is formed in a predetermined position of the base plate 18 in the same process in which the edge 20 is formed on the base plate 18.

A conductive film 32 is formed on substantially the entire surface of the base plate 18. The conductive film 32 is formed of, for example, vapor-deposited metal. Note that the conductive film 32 may be formed on the base plate 18 in such a manner that a sheet is attached to the base plate 18. The circuit board 22 is attached to the upper surface of the base plate 18.

To the housing 16, as separately shown in FIG. 4, the circuit board 22, a heat-dissipating sheet 28, an insulating sheet 30, a first attachment plate 36, a second attachment plate 38, and a card socket plate 40 are attached.

Figure 13:
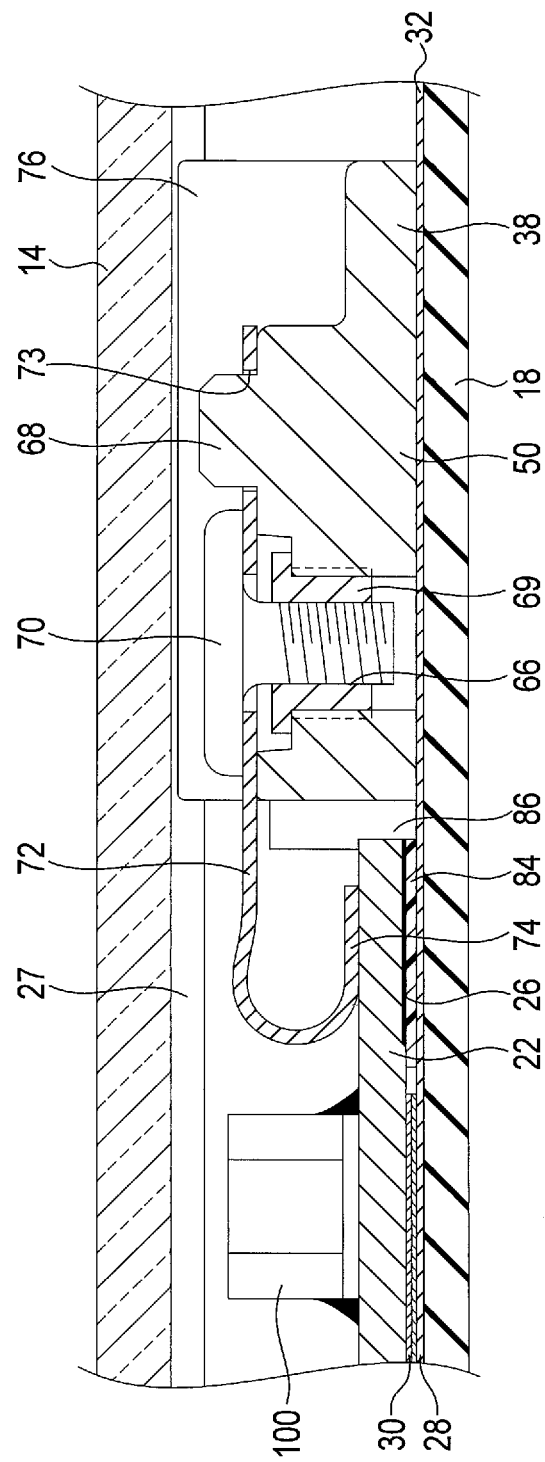
FIG. 13 is a sectional view of a part of the circuit board attachment structure.

To the circuit board 22, more specifically, to the surface on which a predetermined pattern of traces is formed, an electronic component 100 is attached as shown in FIG. 13. The circuit board 22 is a basically inflexible and rigid board and comprises traces on its surface.

Figure 14:
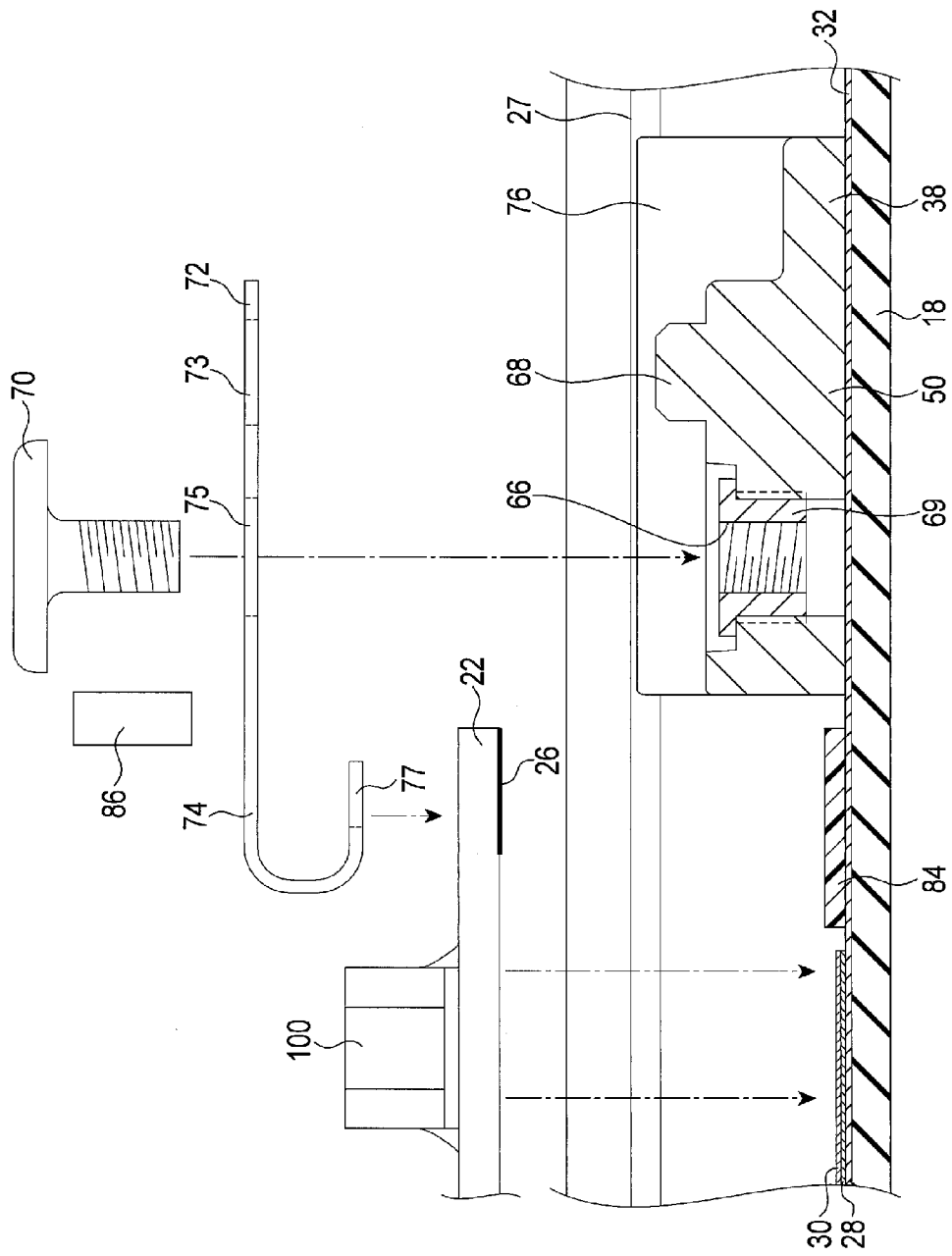
FIG. 14 is an exploded view of a part of the circuit board attachment structure.

The circuit board 22 further comprises, as shown in FIG. 12, a position determination engagement recess 46 at one edge. The engagement recess 46 is formed in accordance with an engagement projection 42, which will be described later. As shown in FIGS. 2 and 14, a ground pad (electrode) 26 is provided on the back surface of the circuit board 22.

The ground pad 26 is formed in such a manner as to be aligned with a holding piece 72, which will be described later, and is connected to a ground line provided on the circuit board 22. The ground pad 26 and the like are provided by a printing method or the like and are basically formed evenly on the back surface of the circuit board 22. Further, a test pad may also be provided on the back surface of the circuit board 22.

The first attachment plate 36 is in the shape of a long, thin rectangle and comprises the engagement projection 42 and a striking portion 44. The first attachment plate 36 is fitted into the edge 20 of the housing 16 and is screwed into the edge 20.

FIG. 12 shows the engagement projection 42. The engagement projection 42 is provided near one end of the first attachment plate 36. The engagement projection 42 is formed in accordance with the engagement recess 46 provided in the circuit board 22 and engages with the engagement recess 46 of the circuit board 22.

FIG. 11 shows the striking portion 44. The striking portion 44 in a planar view is substantially trapezoid, projecting inside the housing 16. When the first attachment plate 36 is fixed to the housing 16, the upper side of the trapezoid is placed in a predetermined position of the back plate 18, and thus the striking portion 44 forms a reference surface for the circuit board 22 to be fixed to the housing 16.

The second attachment plate 38 comprises a first piece 56 and a second piece 58 connected to each other at substantially a right angle and forming an L-shape. The second attachment plate 38 comprises three position alignment holes 47 as shown in FIG. 4.

The position alignment holes 47 correspond to the position determination projections 29 provided in the base plate 18. When the position alignment holes 47 are slid onto the projections 29 of the base plate 18, the second attachment plate 38 is arranged in a predetermined position of the base plate 18.

In the second attachment plate 38, the first piece 56 of the second attachment plate 38 is perpendicular to the first attachment plate 36, and the second piece 58 of the second attachment plate 38 is parallel to the first attachment plate 36. The second attachment plate 38 is attached to the base plate 18 with an adhesive agent.

Further, the second attachment plate 38 comprises a first mount 48, a second mount 50 and a third mount 52. The first piece 56 of the second attachment plate 38 is provided with the first mount 48, and the second piece 58 of the second attachment plate 38 is provided with the second mount 50 and the third mount 52.

The card socket plate 40 is attached to the base plate 18 in such a manner that the one end of the card socket plate 40 is inserted into the long side edge 20b of the housing 16. In the card socket plate 40, a card socket is provided, and a card slot into which a SIM card, a card-type storage medium or the like is inserted is formed. The card socket plate 40 comprises a fourth mount 60.

The second attachment plate 38 and the card socket plate 40, when attached to predetermined positions of the base plate 18, form a substantially rectangular circuit board attachment region 62 on the base plate 18 together with the first attachment plate 36.

Next, each of the first mount 48 to the fourth mount 60 of the second attachment plate 38 and the card socket plate 40 will be described. The first mount 48 is provided at the end of the first piece 56 of the second attachment plate 38 adjacent to the first attachment plate 36.

Note that, since the first mount 48 to the fourth mount 60 have structures substantially the same as each other, the second mount 50 of FIG. 10 will be mainly described below but the first mount 48, the third mount 52 and the fourth mount 60 will be described only with respect to points different from the second mount 50 of FIG. 10 and detailed description thereof will be omitted.

The second mount 50 comprises a female screw 66 and a position determination member 68. The female screw 66 is higher than the level of the upper surface of the circuit board 22 attached to the base plate 18 when the second attachment plate 38 is attached to the base plate 18.

The female screw 66 is formed in such a manner that a screw sleeve 69 is buried in the second mount 50 as shown in FIG. 13. The female screw 66 has a depth sufficient for a male screw 70 to be engaged with the second mount 50. Note that the female screw 66 may also be tapped directly in the second mount 50.

The position determination member 68 is provided on the second mount 50 at a predetermined distance from the female screw 66. The position determination member 68 is substantially cylindrical and has a diameter corresponding to the position determination hole 73 formed in the holding piece 72, which will be described later. The female screw 66 and the position determination member 68 are arranged in such a manner that a contacting portion 74 of the holding piece 72 is located above the circuit board 22 when the holding piece 72 is attached to the second mount 50 with the female screw 66 and the position determination member 68.

Further, a vertical wall 76 is provided around the second mount 50. In the vertical wall 76, the upper edge is higher than the uppermost portion of the male screw 70 when the holding piece 72 is attached to the second mount 50. Although having differences in arrangement of the vertical wall 76 and the like, the first mount 48, the third mount 52 and the fourth mount 60 have structures basically the same as that of the above-described second mount 50.

In the circuit board attachment region 62, as shown in FIGS. 4 and 5, the heat-dissipating sheet 28 is attached to the upper surface of the conductive film 32. The heat-dissipating sheet 28 is formed of a material having excellent thermal conductivity and conducts heat from the circuit board 22 provided above the heat-dissipating sheet 28 to the base plate 18. Further, the insulating sheet 30 is provided on the surface of the heat-dissipating sheet 28. The insulating sheet 30 is formed of an electrically insulating material.

The heat-dissipating sheet 28 and the insulating sheet 30 are shaped substantially the same as each other while having areas slightly greater than that of the circuit board 22. Further, the heat-dissipating sheet 28 and the insulating sheet 30 respectively comprise notches 80 as shown in FIG. 4 and the like. Each notch 80 is provided in proximity to each of the first mount 48 to the fourth mount 60 in alignment with the attachment position of the holding piece 72 and is formed in a predetermined size.

The heat-dissipating sheet 28 and the insulating sheet 30 are attached to the base plate 18 in such a manner as to fully cover the lower surface of the circuit board 22 to be attached to the base plate 18 except for the portions corresponding to the notches 80.

To the portions corresponding to the notches 80, gaskets 84 are attached. Each gasket 84 is of a conductive material having appropriate elasticity, and in a free state, the gasket 84 has a thickness slightly greater than the total thickness of the heat-dissipating sheet 28 and the insulating sheet 30, as shown in FIG. 14. The gasket 84 is attached to the conductive film 32 with a conductive adhesive agent or the like in such a manner as to be fitted into the notch 80 without contacting the heat-dissipating sheet 28 or the insulating sheet 30.

Figure 6:
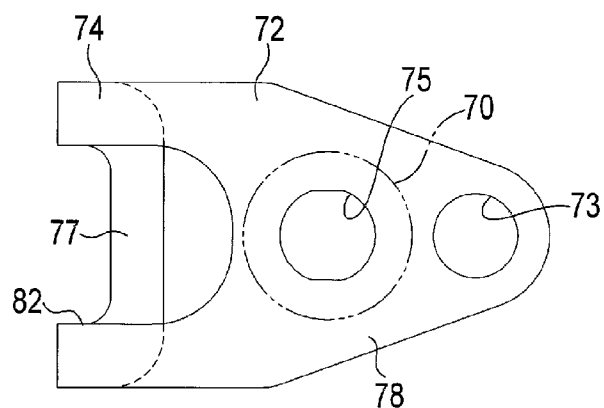
FIG. 6 is a top plan view of a holding piece.
Figure 7:
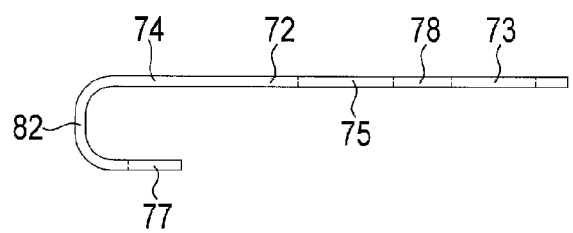
FIG. 7 is a side view of the holding piece.

Next, the holding piece 72 will be described. The holding piece 72 is shown in FIGS. 6 to 9. FIG. 6 is a top plan view of the holding piece 72. FIG. 7 is a side view of the holding piece 72. The holding piece 72 is formed of a metal material having appropriate elasticity. Note that the holding piece 72 may be formed of any material other than a metal material as long as the material has appropriate elasticity.

The holding piece 72 comprises, as shown in FIGS. 6 and 7, a base 78 and the contacting portion 74 continuously formed from the end of the base 78. The base 78 comprises a screw hole 75 and the position determination hole 73.

The screw hole 75 has an internal diameter slightly greater than the diameter of the male screw 70 to be engaged with the female screw 66 of each mount and is thus slightly loose for the male screw 70. The position determination hole 73 has an internal diameter substantially the same as the diameter of the position determination member 68 of each mount and is engaged tightly with the position determination member 68.

Figure 8:
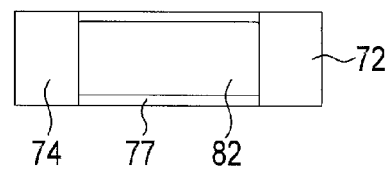
FIG. 8 is a front view of the holding piece.
Figure 9:
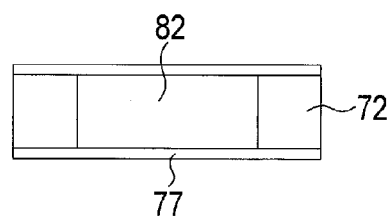
FIG. 9 is a rear view of the holding piece.

The contacting portion 74 has an entirely-curved shape. The contacting portion 74 has a notch 82 in the center. The contacting portion 74 is formed in such a manner as to be divided into two by the notch 82 and then the two divisions connected to each other at an end 77 as shown in FIGS. 8 and 9.

Further, the connecting portion 74 is formed in such a manner that the end 77 of the contacting portion 74 in a free state will be arranged in a position lower than the level of the upper surface of the circuit board 22 attached to the housing 16 when the holding piece 72 is attached to the first mount 48. With this structure, when screwed into the first mount 48 or the like, the contacting portion 74 is pushed and deformed upward by the circuit board 22, and thus the holding piece 72 applies predetermined pressure to the circuit board 22.

Further, when each holding piece 72 is fixed to each mount with the male screw 70, as shown in FIG. 13, the whole holding piece 72 including the male screw 70 will be lower than the upper edge of the vertical wall 76 formed around each mount. The above-described structure of the holding piece 72 is commonly adopted to the first mount 48 to the fourth mount 60.

Figure 10:
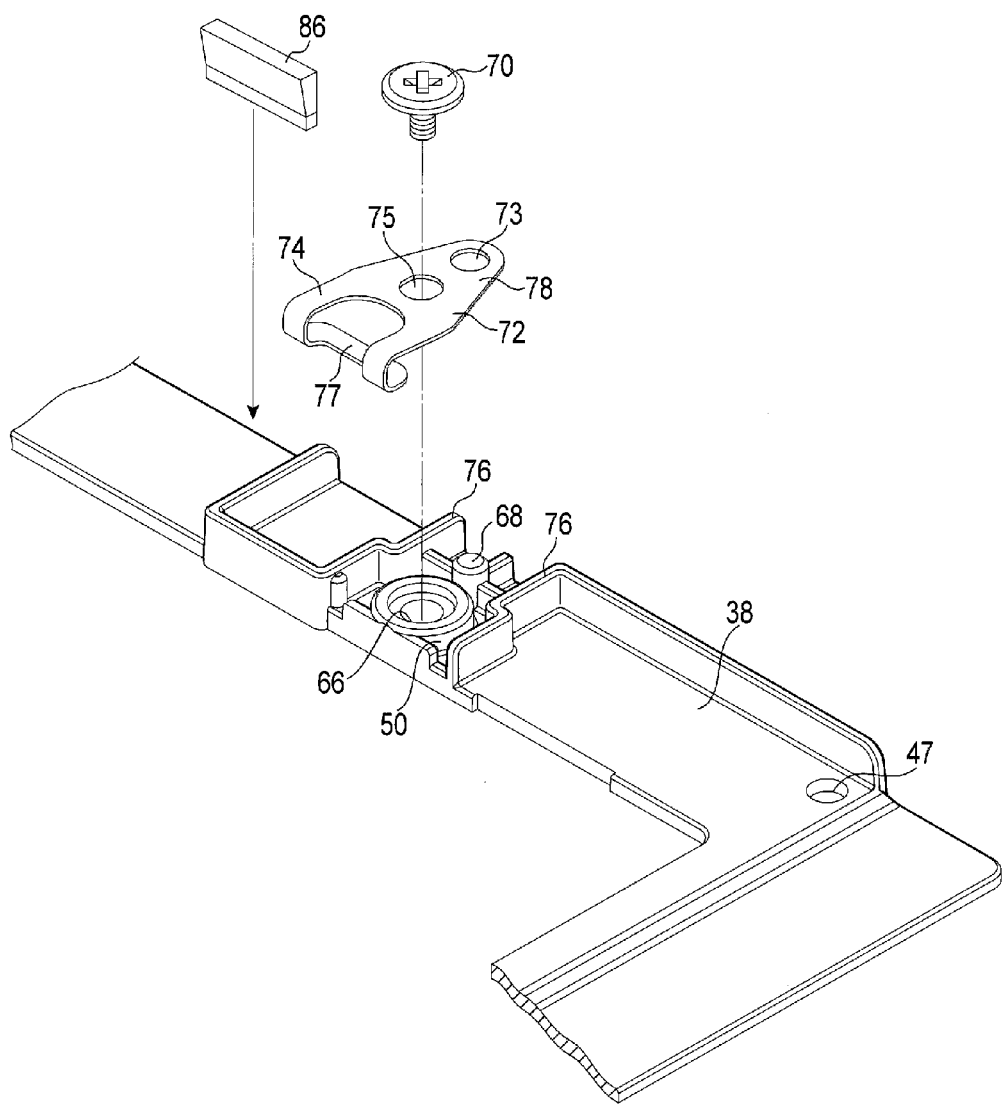
FIG. 10 is an exploded view of a part of a circuit board attachment structure.

Still further, an elastic member 86 is attached to each of the second mount 50 and the third mount 52 as shown in FIGS. 4, 10 and 13. The elastic member 86 is provided between the vertical wall 76 and the circuit board 22, and pushes back the circuit board 22 toward the first attachment plate 36 by an elastic force.

Next, a procedure for attaching the circuit board 22 to the housing 16 will be described. First, the housing 16 is formed. In the housing 16, a synthetic resin is injected into the base plate 18 formed of a carbon-fiber-reinforced resin plate and the edge 20 is thereby formed around the base plate 18, and then the projections 29 are formed in predetermined portions. The conductive film 32 is then formed on substantially the entire surface of the base plate 18.

After the conductive film 32 is formed, the first attachment plate 36 is inserted between the base plate 18 and the upper part of the edge 20 and screwed into the edge 20. The second attachment plate 38 is positioned on the base plate 18 in accordance with the projections 29 and is attached to the base plate 18 with double-sided adhesive tape. The card socket plate 40 is positioned in accordance with a groove formed in the edge 20 and is attached to the base plate 18 with double-sided adhesive tape.

On the base plate 18, the substantially rectangular circuit board attachment region 62 is formed by the first attachment plate 36, the second attachment plate 38 and the card socket plate 40. To the circuit board attachment region 62, the heat-dissipating sheet 28 and the insulating sheet 30 are attached with an adhesive agent or the like.

The heat-dissipating sheet 28 and the insulating sheet 30 cover substantially the entire circuit board attachment region 62. In contrast, the conductive film 32 is exposed from the notches 80 of the heat-dissipating sheet 28 and the insulating sheet 30, that is, conductive portions are formed in proximity to the first mount 48 to the fourth mount 60.

To the conductive portions formed by the notches 80, the gaskets 84 are attached. The gaskets 84 are attached to the conductive film 32 with conductive double-sided adhesive tape or the like. Further, the elastic members 86 are respectively attached in proximity to the second mount 50 and the third mount 52 as shown in FIG. 13.

The circuit board 22 is provided in the circuit board attachment region 62 as shown in FIG. 4. The circuit board 22 is attached in such a manner that the engagement recess 46 engages with the engagement projection 42 and the edge of the circuit board 22 on the side opposite to that provided with the engagement recess 46 is brought into contact with the elastic member 86 attached to the second attachment plate 38. The circuit board 22 is pushed back toward the first attachment plate 36 by the elastic force of the elastic member 86. Then, in the circuit board 22, the edge of the circuit board 22 is brought into contact with the striking portion 44 while the engagement recess 46 engages with the engagement projection 42.

Subsequently, the holding pieces 72 are respectively attached to the first mount 48 to the fourth mount 60. Each of the holding pieces 72 is attached in such a manner that the contacting portion 74 is brought into contact with the circuit board 22, the position determination hole 73 of the base 78 is slid onto the position determination member 68, the male screw 70 is inserted into the screw hole 75, and the male screw 70 is screwed into the female screw 66.

When the holding pieces 72 are fixed to the respective mounts with the male screws 70, the contacting portions 74 of the holding pieces 72 appropriately deform and press the circuit board 22 against the base plate 18 with a predetermined force. This state is shown in FIG. 13.

In this way, the lower surface of the circuit board 22 is pressed against the base plate 18 via the heat-dissipating sheet 28 and the insulating sheet 30. The circuit board 22 is fixed to a predetermined position of the housing 16 by being fitted with the engagement projection 42, brought into contact with the striking portion 44 and held by the holding pieces 72.

Further, as shown in FIG. 14, the gasket 84 is pressed against the conductive film 32 of the base plate 18 by the pressure from the holding piece 72. In this way, the ground pad 26 of the circuit board 22 is electrically connected to the conductive film 32 of the housing 16 via the gasket 84. Consequently, the ground line of the circuit board 22 can function as a ground electrode having a capacitance substantially the same as that of the conductive film 32 extending on the entire base plate 18 of the housing 16. Therefore, it is possible to form a stable ground having little voltage change on the circuit board 22.

Still further, since the pressure of the holding piece 72 is received by the gasket 84, it is possible to avoid an undesirable load from being imposed on the circuit board 22 and to hold the circuit board 22 at a stable contact pressure.

Still further, since the vertical wall 76 of each mount is higher than the top of the male screw 70, the image display panel 14 attached to the housing 16 will not directly contact the male screw 70 even if the image display panel 14 bends in the thickness direction of the tablet computer 12.

Still further, since the holding piece 72 is formed in such a manner as to be divided into two and then the two divisions connected to each other at the end 77, the holding piece 72 has a wide contacting area with the circuit board 22 and pushes back the circuit board 22 by an appropriate elastic force but will not concentrate the contact pressure or impose an inappropriate force on the circuit board 22.

In the case of replacing or repairing the circuit board 22 of the tablet computer 12, the image display panel 14 is removed from the housing 16, the male screws 70 attached to the respective mounts are detached, and the holding pieces 72 are removed from the housing 16.

In this way, the circuit board 22 is released from a fixed state and can be easily detached from the housing 16. Further, the repaired or replacement circuit board 22 can be attached to the tablet computer 12 easily and reliably in the same manner. Note that the holding piece 72 may be attached to the mount not with the male screw 70 but with a detachable socket or the like. Further, the holding piece 72 is not necessarily formed in the above-described shape but may be formed in another shape. Still further, it is also possible to form the holding piece 72 made of an inflexible member and to interpose an elastic member made of a rubber material or the like between the holding piece 72 and the circuit board 22.

Still further, the electronic device is not necessarily limited to a tablet computer. It is possible to apply the present embodiment and the second embodiment, for example, to other electronic devices such as a clamshell computer by adopting the circuit board attachment structure to the housing of a keyboard and the like.

Second Embodiment

A circuit board attachment structure of the second embodiment will be described. The circuit board attachment structure of the second embodiment comprises a base plate 18 made of a conductive material such as, for example, magnesium. Each mount of a circuit board 22 is also formed of a conductive material such as magnesium together with the base plate 18. An edge 20 of a housing 16 may also be formed at this time. Further, on the upper surface the circuit board 22, a ground pad 26 is formed in accordance with the attachment position of the holding piece 72. The rest of the circuit board attachment structure of the second embodiment is the same as that of the circuit board attachment structure of the first embodiment.

In a circuit board attachment region 62 of the housing 16, a heat-dissipating sheet 28 and an insulating sheet 30 are provided. After the circuit board 22 is provided in the circuit board attachment region 62 of the housing 16, a gasket 84 is provided on the ground pad 26.

The holding piece 72 is made of a conductive material such as a metal material. Further, a female screw 66 is tapped directly in each mount. A male screw 70 is directly engaged with the female screw 66 of the mount.

Accordingly to the second embodiment, as shown in FIG. 15, it is possible to reliably fix the circuit board 22 detachably to the mounts of the housing 16 by the holding pieces 72. Further, in the circuit board 22, a ground line provided in the circuit board 22 is electrically connected from the ground pad 26 to the holding piece 72 via the gasket 84 and is then electrically connected from the holding piece 72 to the mount via the male screw 70 and further to the housing 16.

As described above, according to the second embodiment, the housing 16 is formed of a conductive material, the respective mounts are integrally formed with the base plate 18, and the female screws 66 are formed in the respective mounts. Therefore, it is possible to reduce the number of components of the housing and simplify the attachment procedure of the circuit board 22. Still further, the ground line of the circuit board 22 can be reliably grounded to the housing 16.

Note that the gasket 84 or the like may not be interposed between the holding piece 72 and the ground pad 26 as long as the holding piece 72 pushes back the circuit board 22 by an elastic force and is electrically connected to the ground pad 26. However, in light of reliable electrical connection with the ground pad 26, it is preferable that the gasket 84 be interposed between the holding piece 72 and the ground pad 26. Further, each mount is not necessarily formed integrally with the base plate 18 but may be formed separately and attached to the base plate 18 with a conductive adhesive agent or the like as long as the mount is conductive.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A circuit board attachment structure comprising:
   a housing to which a circuit board is attached;
   a mount provided on the housing and provided outside a portion of the housing where the circuit board is attached;

a holding piece extending from the mount to and on the circuit board and sandwiching the circuit board with the housing; and a conductive gasket contacting the circuit board, wherein the gasket is provided at least in a region where the circuit board is sandwiched between the holding piece and the housing, and the gasket is pressed between the holding piece and the housing, and the circuit board and the housing is electrically connected to each other via the pressed gasket.

2. The circuit board attachment structure of claim 1, wherein the gasket is provided between the housing and the circuit board.

3. The circuit board attachment structure of claim 2, wherein the gasket is provided on a ground electrode formed on the circuit board, and the ground electrode is electrically connected to the housing via the gasket.

4. The circuit board attachment structure of claim 3, wherein an elastic member is provided between the circuit board and the holding piece.

5. The circuit board attachment structure of claim 4, wherein the mount is bonded to the housing, and the holding piece is detachably screwed to an upper portion of the mount.

6. The circuit board attachment structure of claim 5, further comprising an insulating heat-dissipating sheet extending between the circuit board and the housing except for a portion corresponding to the gasket.

7. An electronic device comprising the circuit board attachment structure of claim 6.

8. The circuit board attachment structure of claim 1, wherein the gasket is provided between the circuit board and the holding piece, and the circuit board and the housing are electrically connected to each other via the holding piece and the mount.

9. The circuit board attachment structure of claim 8, wherein the gasket is provided on a ground electrode formed on the circuit board, and the ground electrode is electrically connected to the housing via the gasket.

10. The circuit board attachment structure of claim 9, wherein the housing and the mount are made of a conductive material and are formed integrally with each other.

11. The circuit board attachment structure of claim 10, wherein the holding piece is formed of a conductive member and is directly fixed to the mount with a metal screw.

12. An electronic device including the circuit board attachment structure of claim 11.

* * * * *